United States Patent
Schmitt et al.

(10) Patent No.: US 12,146,928 B2
(45) Date of Patent: *Nov. 19, 2024

(54) MAGNETIC FIELD SENSOR WITH OVERCURRENT DETECTION

(71) Applicant: Analog Devices International Unlimited Company, Limerick (IE)

(72) Inventors: Jochen Schmitt, Biedenkopf (DE); Gavin P. Cosgrave, Enniscorthy (IE)

(73) Assignee: Analog Devices International Unlimited Company, Limerick (IE)

( * ) Notice: Subject to any disclaimer, the term of this patent is extended or adjusted under 35 U.S.C. 154(b) by 151 days.

This patent is subject to a terminal disclaimer.

(21) Appl. No.: 17/720,039

(22) Filed: Apr. 13, 2022

(65) Prior Publication Data

US 2022/0326322 A1   Oct. 13, 2022

Related U.S. Application Data

(63) Continuation-in-part of application No. 17/715,811, filed on Apr. 7, 2022.

(Continued)

(51) Int. Cl.
*G01R 33/09* (2006.01)
*G01R 33/00* (2006.01)
*H10N 50/85* (2023.01)

(52) U.S. Cl.
CPC ........ *G01R 33/096* (2013.01); *G01R 33/0011* (2013.01); *H10N 50/85* (2023.02)

(58) Field of Classification Search
CPC .............. G01R 33/096; G01R 33/0011; G01R 19/16571; G01R 15/205; G01R 33/0005;

(Continued)

(56) References Cited

U.S. PATENT DOCUMENTS 8,525,514 B2   9/2013  Cai et al.
8,896,295 B2   11/2014 Friedrich et al.
(Continued)

FOREIGN PATENT DOCUMENTS

DE   102014219238 A1   3/2016
EP   3088908            11/2016
(Continued)

OTHER PUBLICATIONS

"German Application Serial No. 102022108692.5, Office Action mailed Dec. 3, 2022", w/ English Machine Translation, 15 pgs.

(Continued)

*Primary Examiner* — Alvaro E Fortich
(74) *Attorney, Agent, or Firm* — Schwegman Lundberg & Woessner, P.A.

(57) ABSTRACT

The present disclosure provides a magnetic field sensor system, comprising an AMR magnetic field sensor and an overcurrent detection sensor. The overcurrent detection sensor comprises an AMR sensing element connected in a half bride arrangement with a field insensitive component. The output of the overcurrent detection sensor is able to monitor the strength of the magnetic field experiences by the sensor system, and detect if the magnet field goes beyond a sensing threshold of the AMR magnetic field sensor. Outside of this threshold, the AMR magnet field sensor is unable to provide a measurement of the magnetic field strength. The overcurrent detection sensor can therefore detect that the system is operating in very high magnetic fields, which in turn can indicate that there is overcurrent in the system.

24 Claims, 23 Drawing Sheets

Related U.S. Application Data

(60) Provisional application No. 63/173,903, filed on Apr. 12, 2021.

(58) Field of Classification Search
CPC . G01R 33/0017; G01R 33/0023; H10N 50/85
See application file for complete search history.

(56) References Cited

U.S. PATENT DOCUMENTS

| | | |
|---|---|---|
| 9,903,920 B2 | 2/2018 | Grimm et al. |
| 9,989,563 B2 | 6/2018 | Peczalski et al. |
| 10,739,165 B2 | 8/2020 | Schmitt |
| 2009/0102464 A1* | 4/2009 | Doogue ............... G01R 33/093 324/252 |
| 2013/0099783 A1* | 4/2013 | Kubik ................ G01R 33/0005 324/252 |
| 2013/0320972 A1 | 12/2013 | Loreit et al. |
| 2016/0223699 A1* | 8/2016 | Peczalski ............. G01R 15/205 |
| 2018/0321282 A1 | 11/2018 | Hurwitz |
| 2020/0300943 A1 | 9/2020 | Yuan |
| 2021/0311141 A1 | 10/2021 | Schmitt |
| 2022/0326321 A1 | 10/2022 | Schmitt et al. |

FOREIGN PATENT DOCUMENTS

| | | |
|---|---|---|
| EP | 3171190 | 5/2017 |
| JP | 6380530 B2 | 8/2018 |
| WO | 2015030871 | 3/2015 |
| WO | WO-2015182645 A1 | 12/2015 |

OTHER PUBLICATIONS

"U.S. Appl. No. 17/715,811, Non Final Office Action mailed Dec. 29, 2023", 12 pgs.

"U.S. Appl. No. 17/715,811, Examiner Interview Summary mailed Apr. 9, 2024", 2 pgs.

"U.S. Appl. No. 17/715,811, Notice of Allowance mailed May 1, 2024", 9 pgs.

"U.S. Appl. No. 17/715,811, Response filed Mar. 29, 2024 to Non Final Office Action mailed Dec. 29, 2023", 9 pgs.

* cited by examiner

MAGNETIC FIELD SENSOR WITH OVERCURRENT DETECTION

CLAIM OF PRIORITY

This is a Continuation-in-Part of U.S. patent application Ser. No. 17/715,811, filed Apr. 7, 2022, which claims priority to U.S. Provisional Application Ser. No. 63/173,903, filed Apr. 12, 2021, which is hereby incorporated by reference herein in its entirety.

FIELD OF THE INVENTION

The present disclosure relates to a magnetic field sensor. In particular, the present disclosure relates to a sensing system comprising a magnetic yield sensor and an overcurrent detection sensor.

BACKGROUND

Anisotropic-magnetoresistive (AMR) sensors are used to sense external magnetic fields by detecting a change in resistance of the sensor as a result of the external magnetic field. Some AMR sensors have a so-called "barber pole" structure, with a resistive strip that has conductive strips arranged thereon in a pattern resembling a barber pole.

SUMMARY

The present disclosure provides a magnetic field sensor system, comprising an AMR magnetic field sensor and an overcurrent detection sensor. The overcurrent detection sensor comprises an AMR sensing element connected in a half bridge arrangement with a field insensitive component. The output of the overcurrent detection sensor is able to monitor the strength of the magnetic field experiences by the sensor system, and detect if the magnetic field goes beyond a sensing threshold of the AMR magnetic field sensor. Outside of this threshold, the AMR magnet field sensor is unable to provide a measurement of the magnetic field strength. The overcurrent detection sensor can therefore detect that the system is operating in very high magnetic fields, which in turn can indicate that there is overcurrent in the system.

A first aspect of the present disclosure provides a magnetic field sensor system, comprising an anisotropic-magnetoresistive (AMR) magnetic field sensor configured to measure an externally applied magnetic field, and an overcurrent detection sensor comprising at least one AMR sensing element, the overcurrent detection sensor being configured to detect the presence of a high electrical current based on a measurement of the externally applied magnetic field.

As such, an additional AMR based overcurrent detection sensor is provided, along with the existing AMR field sensor. This AMR based overcurrent detection sensor is used to detect high magnetic fields, and thereby detect if there is excess current passing through the system.

For example, the AMR magnetic field sensor may be operable to provide an output signal indicative of magnetic field strength up to a threshold value. The overcurrent detection sensor may then be operable to provide an output signal indicative of magnetic field strength up to and over the threshold value. The overcurrent detection sensor may therefore detect a presence of a high electrical current if the output signal indicates a magnetic field strength above the threshold value. Consequently, if a high electrical current is passing through the system (e.g., due to a short), the overcurrent detection sensor can be used to detect any magnetic field generated the increase in current that the field sensor is unable to detect.

The overcurrent detection sensor may further comprise a field insensitive component. In this respect, the AMR sensing element of the overcurrent detection sensor and the field insensitive component may be connected in a half bridge configuration.

As one example, the field insensitive component may comprise at least two AMR barber pole resistors comprising a strip of anisotropic-magnetoresistive material having a plurality of conductive strips disposed on the strip of anisotropic-magnetoresistive material at an angle relative to a longitudinal axis of the strip of anisotropic-magnetoresistive material, the at least two AMR barber pole resistors being connected in series and having conductive strips orientated in opposing directions.

As another example, the field insensitive component may comprise a strip of anisotropic-magnetoresistive material having a large shape anisotropy. As a further example, the field insensitive component may comprise a plurality of AMR sensing elements connected in series and a soft magnetic shield placed in proximity to the plurality of AMR sensing elements.

In some arrangements, the overcurrent detection sensor may comprise at least two AMR sensing elements and at least two field insensitive components, connected in a Wheatstone bridge configuration.

The overcurrent detection sensor may comprise at least two AMR sensing elements connected in series, and a field insensitive component comprising at least one pair of AMR barber pole resistors connected in series, each AMR barber pole resistor comprising a strip of anisotropic-magnetoresistive material having a plurality of conductive strips disposed on the strip of anisotropic-magnetoresistive material at an angle relative to a longitudinal axis of the strip of anisotropic-magnetoresistive material, wherein the at least two AMR sensing elements and the field insensitive component are connected to form a first half bridge arrangement.

In such arrangements, the plurality of conductive strips of each AMR barber pole resistor may be orientated in the same direction, and the strip of anisotropic-magnetoresistive material of each AMR barber pole resistor may be magnetised in opposing directions.

Furthermore, the at least one pair of AMR barber pole resistors may comprise a first pair of AMR barber pole resistors, each having a plurality of conductive strips orientated at a first angle, wherein the strip of anisotropic-magnetoresistive material of each AMR barber pole resistor in the first pair is magnetised in opposing directions, and a second pair of AMR barber pole resistors, each having a plurality of conductive strips orientated at a second angle, the second angle being different to the first angle, wherein the strip of anisotropic-magnetoresistive material of each AMR barber pole resistor in the second pair is magnetised in opposing directions.

The overcurrent detection sensor may further comprise a second half bridge arrangement, the second half bridge arrangement comprising at least two AMR sensing elements connected in series, and a field insensitive component comprising at least one pair of AMR barber pole resistors connected in series, wherein the first and second half bridge arrangements are connected in a Wheatstone bridge configuration.

In arrangements described herein, the magnetic sensor system may further comprise at least one flipping coil arranged in proximity to the AMR magnetic field sensor and the overcurrent detection sensor. In some cases, a single flipping coil is arranged over the AMR magnetic field sensor and the overcurrent detection sensor. Alternatively, separate flipping coils are provided for each of the AMR magnetic field sensor and the overcurrent detection sensor. Similarly, the flipping coil(s) may be arranged under the respective sensors.

The magnetic sensor system may further comprise a cross-field detection sensor comprising at least one AMR sensing element, wherein the at least one AMR sensing element is arranged in a plane perpendicular to a sensing direction of the AMR magnetic field sensor. In this respect, a cross-field detection sensor may be provided by rotating any of the overcurrent detection sensors described herein by 90° relative to the sensing direction of the AMR magnetic field sensor.

In cases where a differential magnetic field is to be monitored, the overcurrent detection sensor may comprise a first set of AMR sensing elements connected in a first half bridge arrangement and operable to output a signal indicative of a magnetic field strength of a first differential magnetic field up to and over a threshold value, and a second set of AMR sensing elements connected in a second half bridge arrangement and operable to output a signal indicative of a magnetic field strength of a second differential magnetic field up to and over the threshold value.

For example, the first set of AMR sensing elements may comprise a first pair of sensing elements located at a first sensing position in the vicinity of the first differential magnetic field and a second pair of sensing elements located at a second sensing position, the first and second sensing position being separated by a first distance. The second set of AMR sensing elements may comprise a third pair of sensing elements located at the second sensing position and a fourth pair of sensing elements located at a third sensing position in the vicinity of the second differential magnetic field, the second and third sensing position being separated by a second distance, wherein the second sensing position is between the first and third sensing position. In such cases, there may be no effective magnetic field at the second sensing position.

In the arrangements described herein, the AMR magnetic field sensor may comprise a plurality of AMR barber pole resistors, each AMR barber pole resistors comprising a strip of anisotropic-magnetoresistive material having a plurality of conductive strips disposed on the strip of anisotropic-magnetoresistive material and orientated at an angle relative to a longitudinal axis of the strip of anisotropic-magnetoresistive material, wherein the plurality of AMR barber pole resistors are connected in a Wheatstone bridge configuration.

In cases where a differential magnetic field is to be monitored, the AMR magnetic field sensor may comprise a first set of AMR barber pole resistors connected in a first half bridge arrangement and operable to output a signal indicative of a magnetic field strength of a first differential magnetic field up to a threshold value, and a second set of AMR barber pole resistors connected in a second half bridge arrangement and operable to output a signal indicative of a magnetic field strength of a second differential magnetic field up to a threshold value.

BRIEF DESCRIPTION OF THE DRAWINGS

The present disclosure will now be described by way of example only with reference to the accompanying drawings in which.

DETAILED DESCRIPTION

Anisotropic-magnetoresistive (AMR) sensors are used to sense external magnetic fields by detecting a change in resistance of the sensor as a result of the external magnetic field, with some AMR sensors having a so-called "barber pole" structure, with a resistive strip that has strips of conductive material disposed on the resistive strip at an angle relative to the longitudinal axis of the resistive strip. In this respect, the resistive strip is formed of AMR material, whilst the conductive strips are formed of any suitable conductive material such as Copper, Aluminium or Gold.

Figure 1B:
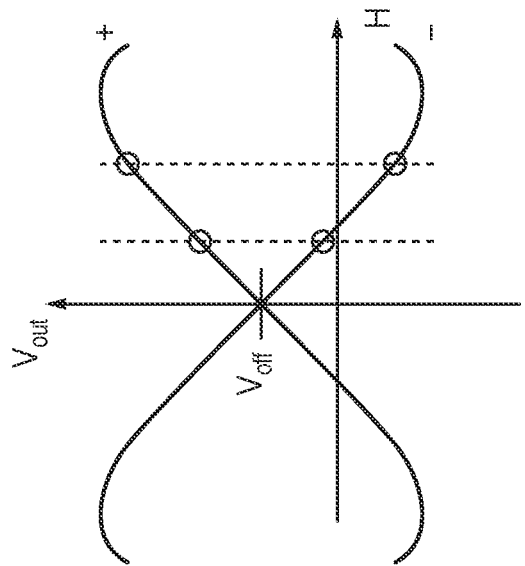
FIGS. 1A-1B illustrate an example of an AMR field sensor with a barber pole structure.
Figure 1A:
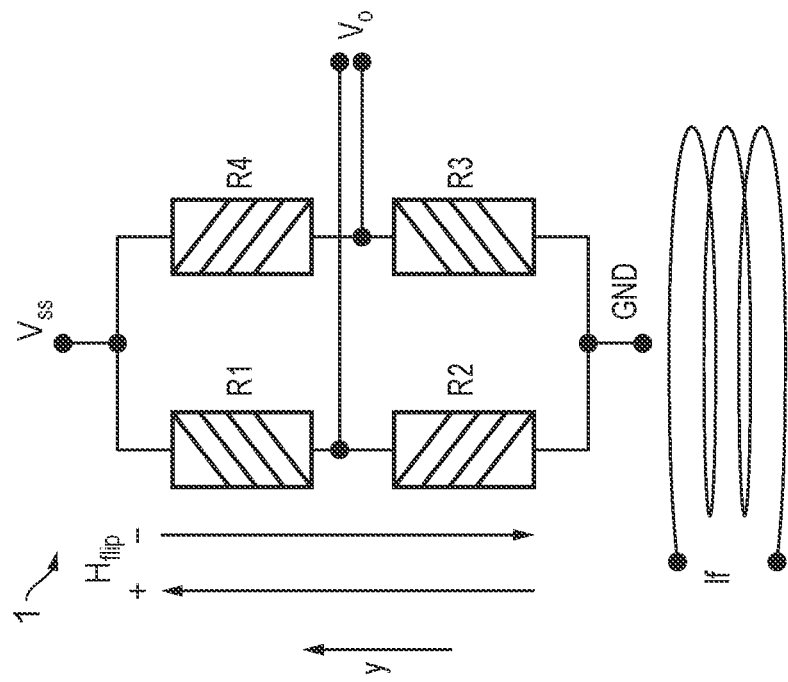

An example of a typical AMR barber pole sensor 1 is shown in FIG. 1A.

The sensor 1 comprises four AMR barber pole resistors R1-R4 connected in a Wheatstone bridge. The AMR barber pole resistors R1-R4 are connected between a supply voltage Vss and ground GND, with output signal terminals provided between each pair of resistors to provide the output signal Vo. A flipping coil, If, is also provided to magnetise the AMR resistors, which allows the direction of sensitivity to be changed with the application of a short current pulse. In this respect, the magnetising field H generated by the coil may point in either the positive y-direction or the negative y-direction. FIG. 1B shows a typical voltage output of the sensor 1 depending on the magnetic field strength experienced by the sensor. The curve denoted "+" is the signal after a positive flip pulse, and the curve denoted "−" is the signal after a negative flip pulse. The flipping allows a separation of the sensor signal from the offset, $V_{off}$.

One significant drawback of this sensor type is that the output signal decreases if the magnetic field reaches a certain level, and for very high magnetic fields, can go back to zero. In other words, there is an upper limit of magnetic field strength in the positive and negative direction, outside of which the sensor signal does not provide an accurate measurement of the magnetic field. In some applications, such as motor commutation, it is not always possible to detect that a short has occurred, particularly as the current increase may happen within a 100 nanosecond time frame. The high current experienced in a short will result in a correspondingly high magnet field, which may exceed the magnetic field threshold of the sensor 1. The commutator may not be able to follow the sensor signal and will not detect that the magnetic field threshold of the sensor 1 has been passed. This can consequently result in a short going undetected, leading to overcurrent through the system, which can ultimately result in overheating and the risk of significant damage.

The solution proposed by the present disclosure is to provide an additional AMR based overcurrent detection sensor, along with the existing field sensor. This AMR based sensor is used to detect high magnetic fields, and thereby detect if there is excess current passing through the system.

Figure 2:
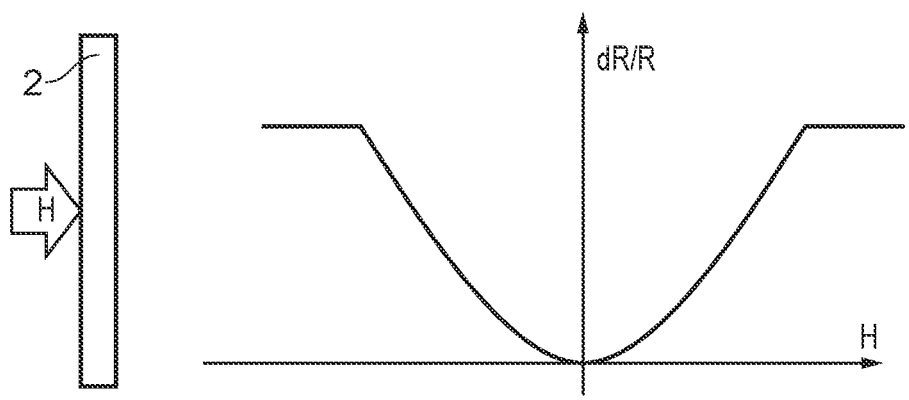
FIG. 2 illustrates the resistance response of an AMR sensor element.

This can be achieved using one or more AMR sensor elements with no barber poles. FIG. 2 shows a single AMR sensor element 2, and the relative resistance response dR/R to a magnetic field applied perpendicular to the longitudinal direction of the sensor element 2. This response can thus be used to detect a magnetic field level.

Figure 3A:
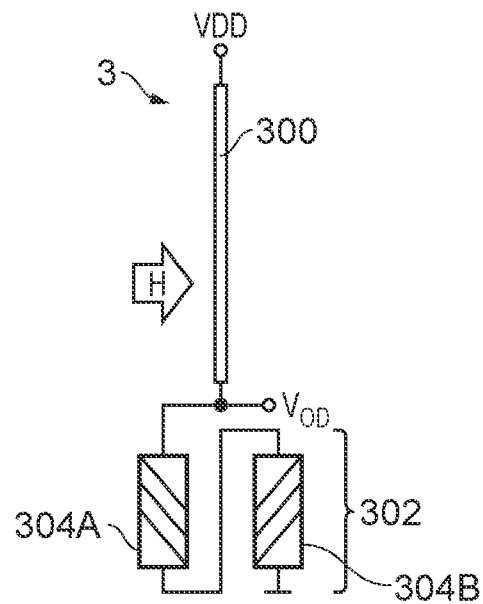
FIG. 3A is an example of an overcurrent detection sensor in accordance with embodiments of the present disclosure.
Figure 3B:
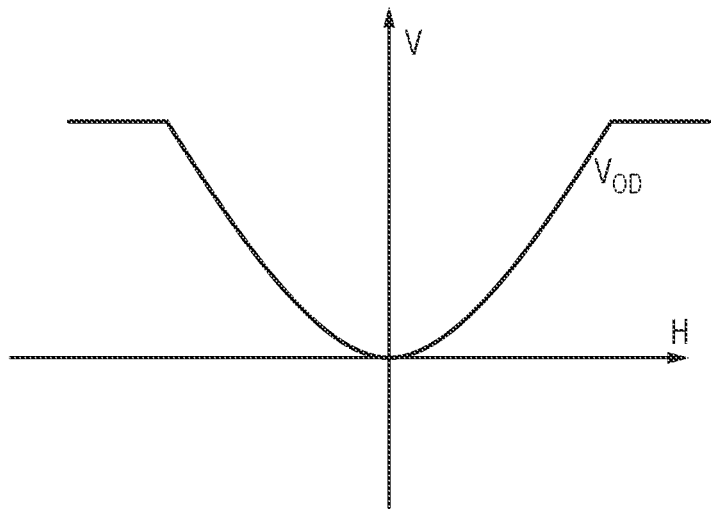
FIG. 3B illustrates an output signal of the sensor of FIG. 3A.

FIG. 3A is an example of an overcurrent detection sensor 3 in accordance with embodiments of the present disclosure. The overcurrent detection sensor 3 comprises an AMR sensor element 300 and a field insensitive element 302 connected in a half bridge. The AMR sensor element 300 and field insensitive element 302 are connected between a voltage supply VDD and ground, with an output signal terminal provided therebetween to provide the output signal $V_{OD}$. In this example, the field insensitive element 302 is provided by using two barber pole resistors 304A-B with different barber pole directions connected in series. It is also important to build the barber pole resistors 304A-B using AMR material so that they have the same temperature coefficient of resistance as the AMR sensor element 300. When a magnetic field (denoted by arrow "H") is applied perpendicular to the longitudinal direction of the AMR sensor element 300, the output signal $V_{OD}$ can be used to determine the field strength of the magnetic field, as shown in FIG. 3B, with very high magnetic fields being indicative of overcurrent in the system.

Figure 4A:
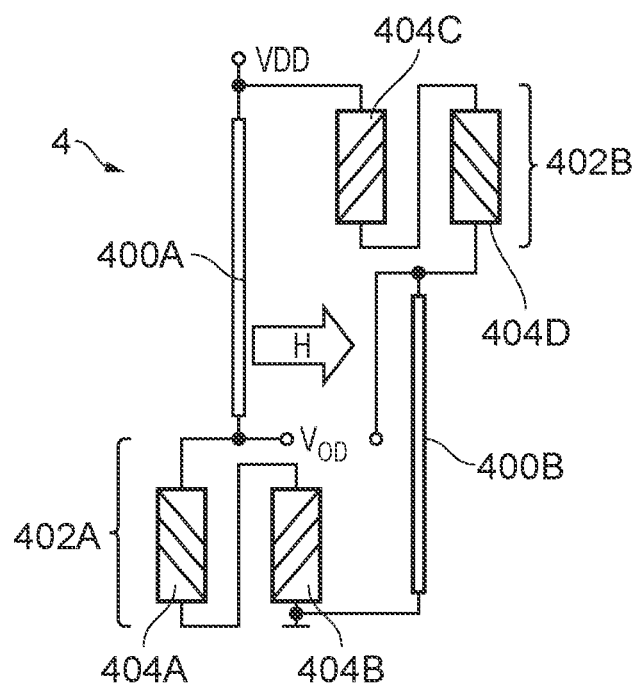
FIG. 4A is another example of an overcurrent detection sensor in accordance with embodiments of the present disclosure.
Figure 4B:
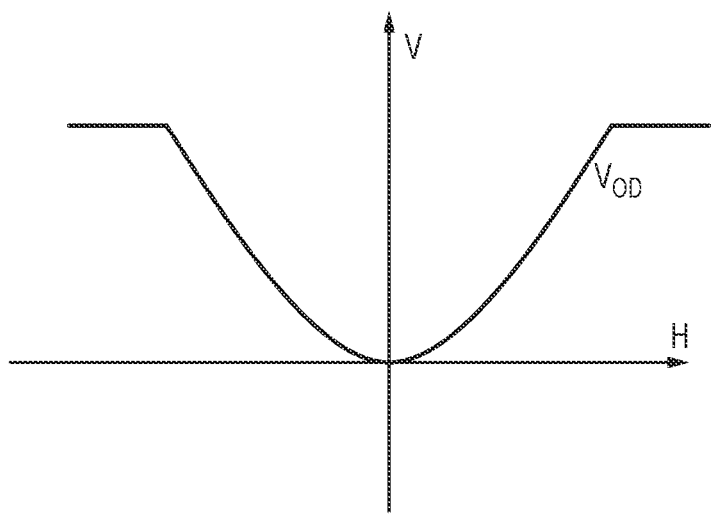
FIG. 4B illustrates an output signal of the sensor of FIG. 4A.

As illustrated by FIG. 4A, it is also possible to build an overcurrent detection sensor 4 having a full bridge configuration, whereby two of the half bridges shown in FIG. 3A are connected to form a full bridge. As such, the overcurrent detection sensor 4 comprises two half bridges formed of an AMR sensor element 400A, 4006 and a field insensitive element 402A, 4026 comprising two barber pole resistors 404A-B, 404C-D, connected to form a full bridge. As shown in FIG. 46, the output signal $V_{OD}$ is again indicative of the strength of the magnetic field being applied perpendicular to the longitudinal direction of the overcurrent detection sensor 4.

Figure 5A:
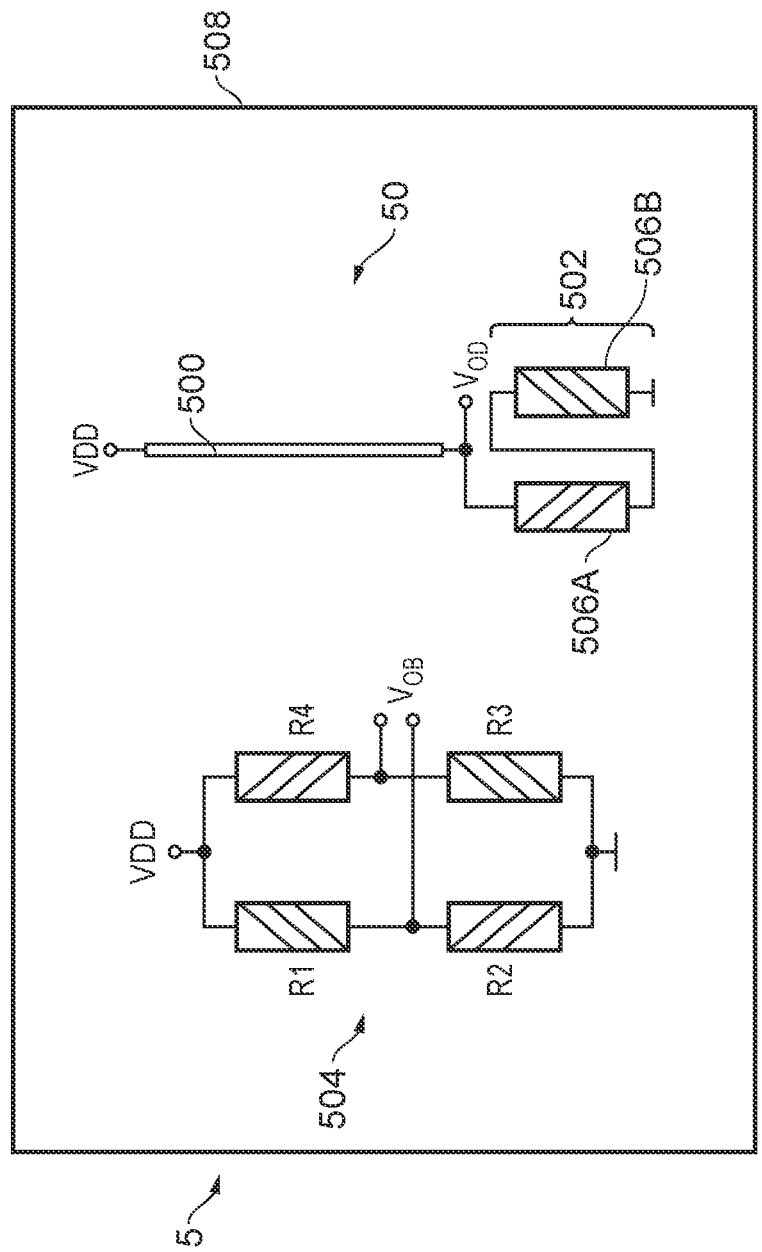
FIG. 5A is an example of a sensor system in accordance with embodiments of the present disclosure.
Figure 5B:
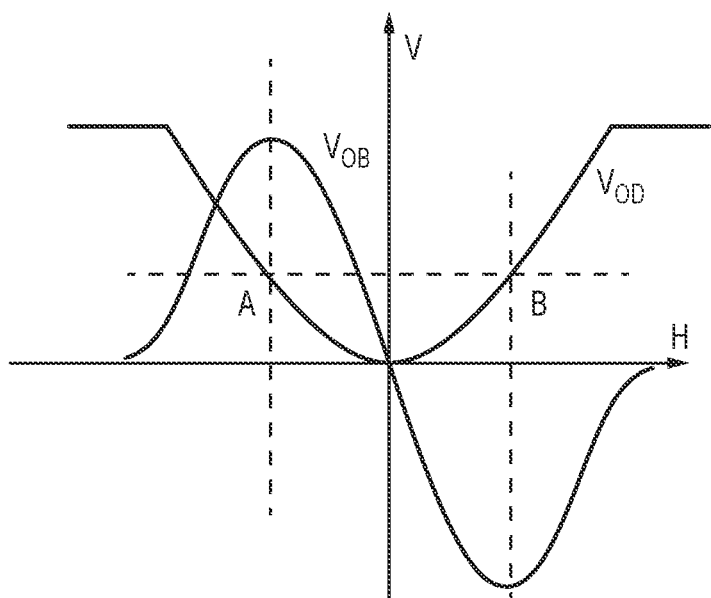
FIG. 5B illustrates the output signals of the sensor system of FIG. 5A.

FIG. 5A illustrates a sensor system 5 according to the present disclosure, whereby an AMR field sensor 504, similar to that described with reference to FIG. 1, is combined with an overcurrent detection sensor 50. The overcurrent detection sensor 50 is similar to that shown in FIG. 3A, formed of an AMR sensor element 500 connected in a half bridge with a field insensitive element 502 comprising two barber pole resistors 506A-6, It will of course be appreciated that any of the overcurrent detection sensors described herein may be used in conjunction with the AMR field sensor 504. In this example, the overcurrent detection sensor 50 and the AMR field sensor 504 are disposed on an integrated circuit 508, although it may be appreciated that the sensors may be disposed on separate substrates positioned side by side. In use, the sensor system 5 will also have one or more flip coils (not shown) arranged on top or under it, as will be described in more detail below.

FIG. 56 illustrates the output $V_{OB}$ of the AMR field sensor 504 and the output of $V_{OD}$ of the overcurrent detection sensor 50 as a function of magnetic field strength. The output $V_{OD}$ of the overcurrent detection sensor 50 can thus be used to identify the maximum magnetic field strength at which output signal $V_{OB}$ of the AMR field sensor 504 will start to decrease to zero, denoted by points A and B, and thereby detect if the magnetic field is outside of this range of magnetic field strengths. If the output signal $V_{OD}$ of the overcurrent detection sensor 50 indicates that the magnetic field is above the threshold A and B, this is indicative of a high amount of current in the system, which may then indicate that a short has occurred in the system. Furthermore, by having the two sensors, the overall measurement range of the system can be increased, whereby the output $V_{OB}$ of the AMR field sensor 504 provides the magnetic field strength measurement up to a certain point, and when the magnetic field strength passes this point, the output of $V_{OD}$ of the overcurrent detection sensor 50 is used to give magnetic field strength, whilst the signal output $V_{OB}$ of the AMR field sensor 504 can still be used to indicate the field direction. For example, when the magnetic field strength is below 30% of the maximum value measurable by the overcurrent detection sensor 50, i.e., 30% the maximum value of output of $V_{OD}$, the signal output $V_{OB}$ of the AMR field sensor 504 is used to give both field strength and direction. Once the magnetic field strength goes above this 30% threshold, the output of $V_{OD}$ of the overcurrent detection sensor 50 is used to determine the magnetic field strength, whilst the signal output $V_{OB}$ of the AMR field sensor 504 is used to determine the field direction. It will of course be appreciated that the thresholds A and B may be adjusted to any suitable level, for example, depending on the sensitivity of the AMR field sensor 504 being used and the normally expected field strength of the magnetic field being monitored by the AMR field sensor 504.

Figure 6A:
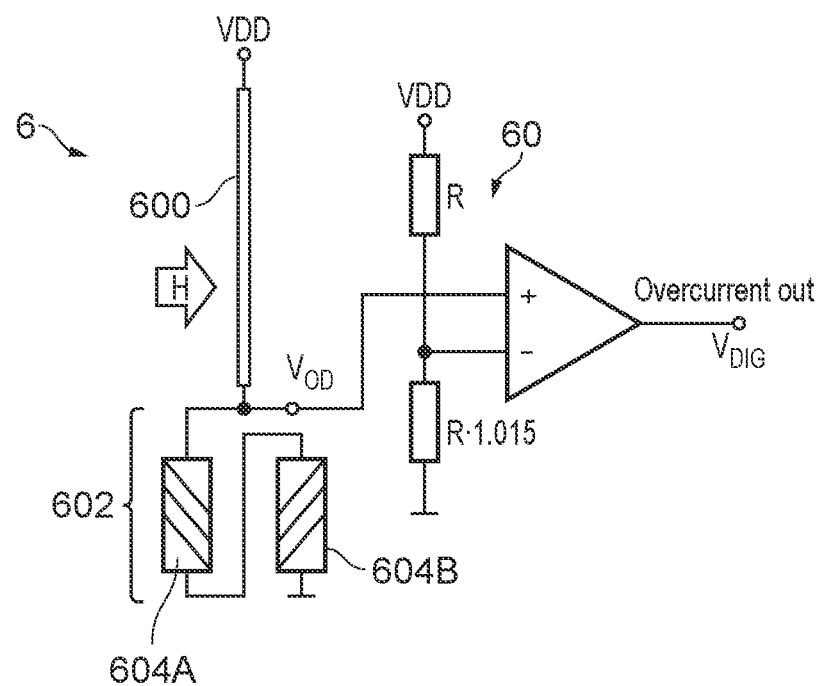
FIG. 6A is a further example of an overcurrent detection sensor in accordance with embodiments of the present disclosure.
Figure 6B:
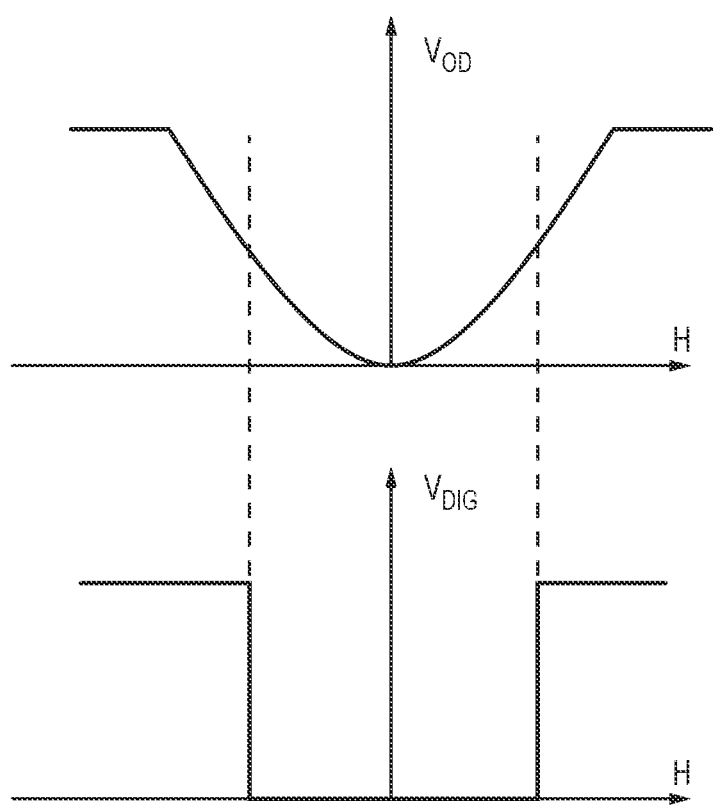
FIG. 6B illustrates an output signal of the sensor of FIG. 6A

FIG. 6A illustrates a simple comparator circuit 60 used to detect the mid-point of the overcurrent detection sensor 6, assuming a maximum dR/R of 3% typically exhibited in a permalloy film. As shown in FIG. 6B, the output \ha; can be used to find the mid-points of the output $V_{OD}$ of the overcurrent detection sensor 6, which will be equivalent to the threshold points of the AMR field sensor. The AMR sensor element 600 and the resistors 604A-B of the field insensitive portion 602 would ideally have the same resistance in an environment without a magnetic field present. In practice, there is typically an offset that has to be accounted for, so that the voltage divider can be adjusted to align the mid-points of the overcurrent detection sensor 6 with the threshold points of the AMR field sensor (not shown).

Figure 7:
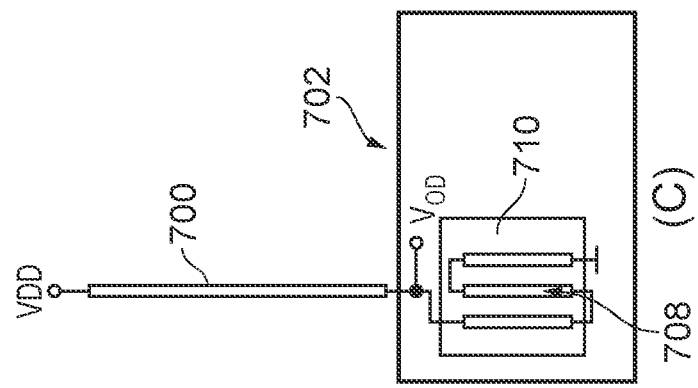
FIG. 7 illustrates further examples of overcurrent detection sensors in accordance with embodiments of the present disclosure.
Figure 7:
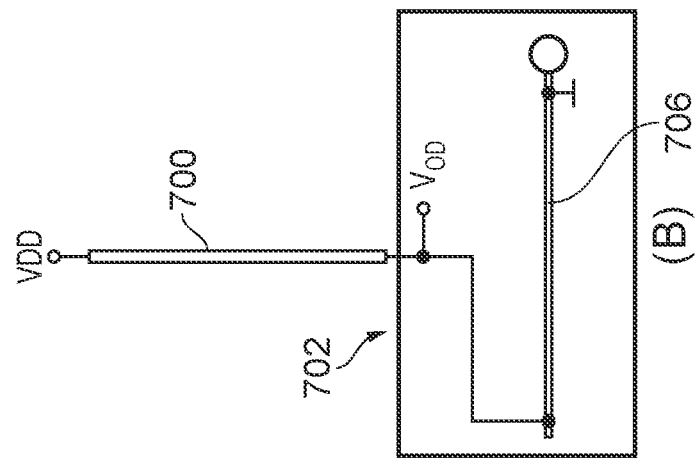
Figure 7:
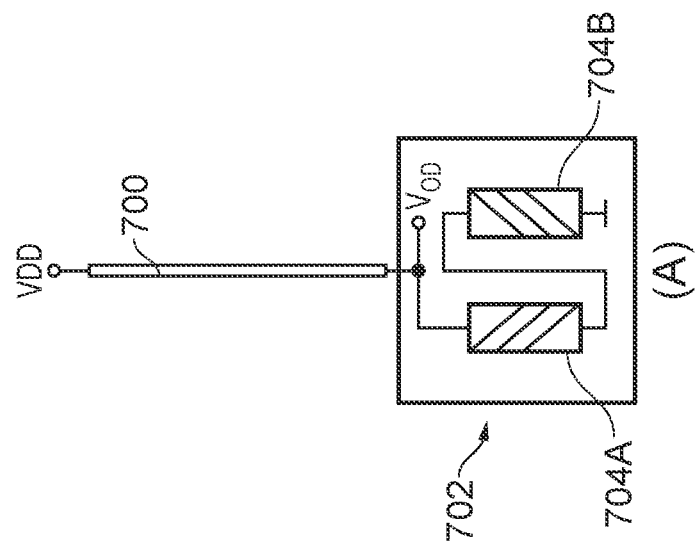

FIG. 7 provides some alternative examples of the AMR field insensitive elements 702 that may be used in the overcurrent detection sensor, Example (A) corresponds to those described above, whereby the field insensitive element 702 is two AMR barber pole resistors 704A-B with different barber pole directions connected in series. In example (B), a narrow track 706 of AMR material having a large shape anisotropy is used, as a resistor with a strong shape anisotropy will not change resistance in a low field environment. In example (C), a plurality of AMR resistor elements 708 connected in series are shielded from the magnetic field by a soft magnetic material 710 placed in proximity over or under the resistor elements 708.

Figure 8:
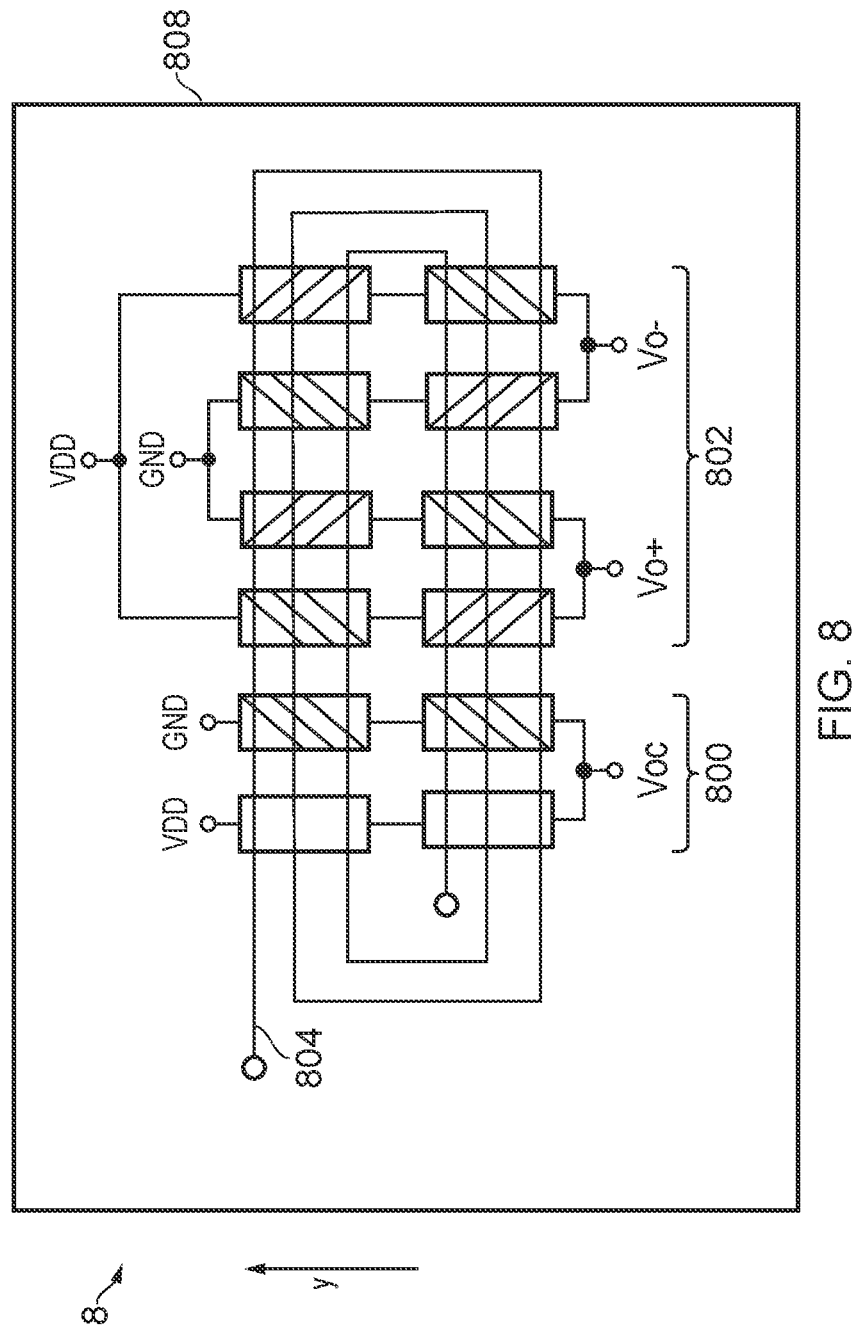
FIG. 8 is another example of a sensor system in accordance with embodiments of the present disclosure.

FIG. 8 shows an example of sensor system 8 according to the present disclosure, comprising an overcurrent detection sensor 800 and an AMR field sensor 802 disposed on an integrated circuit 808.

In this example, the AMR field sensor 802 comprises eight barber pole resistors connected in a Wheatstone bridge arrangement between the voltage supply VDD and ground GND. A flip coil 804 runs over the top of (or under) the resistors, magnetising the upper set of resistors in a different direction compared to the lower set resistors. For example, for a current flowing clockwise through the coil, the top resistors may be magnetised in the positive y-direction and the bottom resistors may be magnetised in the negative y-direction. For that reason, each pair of resistors connected in series, that is, each branch, have different barber pole directions. This arrangement helps to significantly reduce cross field effects.

The overcurrent detection sensor 800 is built in the substantially the same way, however, the barber pole resistors providing the field insensitive part will have the same barber pole directions but magnetised in opposing directions. Consequently, the sum of both resistors is expected to be constant in an external field. Similarly, the overcurrent sensing elements (i.e., the AMR elements without barber poles) are magnetised in opposing directions. This again helps to reduce cross field effects significantly.

Figure 9:
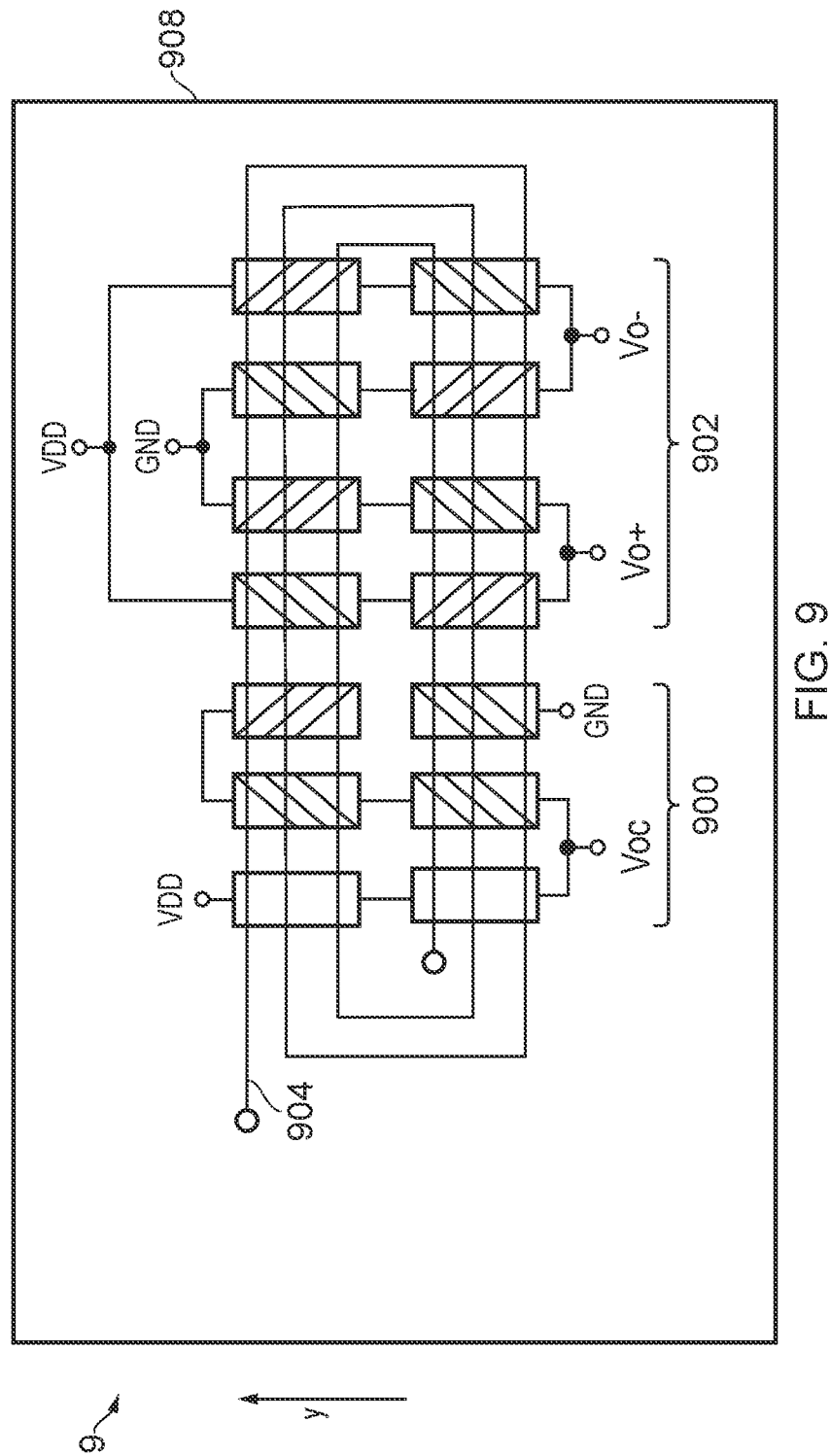
FIG. 9 is a further example of a sensor system in accordance with embodiments of the present disclosure.

FIG. 9 shows another example sensor system 9 that is similar to that of FIG. 8, wherein the field insensitive part of the overcurrent detection sensor 900 comprises two pairs of barber pole resistors having opposing barber pole directions. As such, all possible combinations of barber pole direction and magnetisation direction are provided, which further reduces cross field effects.

Figure 10:
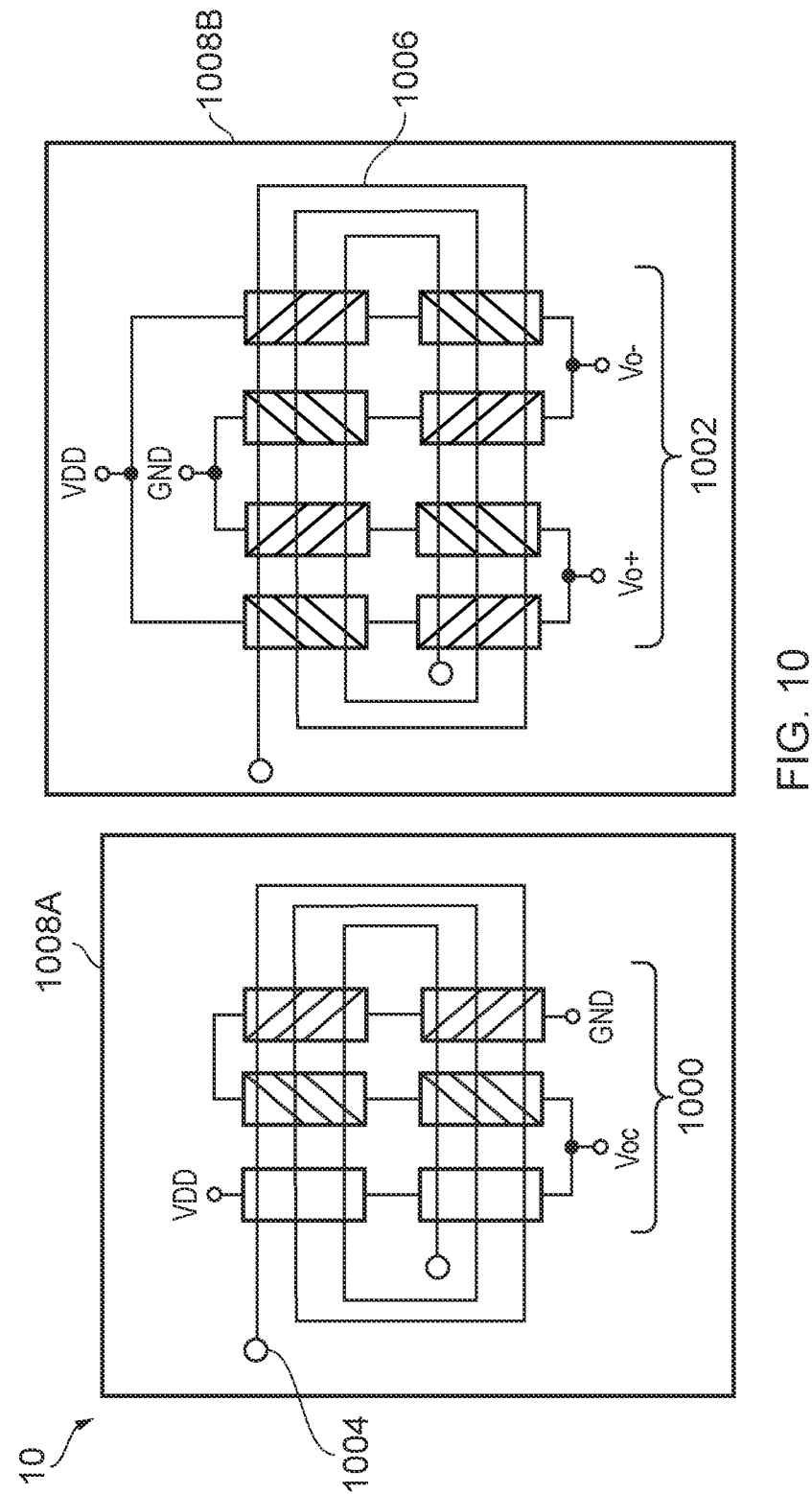
FIG. 10 is a further example of a sensor system in accordance with embodiments of the present disclosure.

FIG. 10 shows an example sensor system 10 similar to that of FIG. 9, however, in this example separate flip coils 1004, 1006 are used for the overcurrent detection sensor 1000 and AMR field sensor 1002. Typically, when the flip coil 1006 of the AMR field sensor 1002 is used to flip the magnetisation of the sensor 1002, there is a short time where the sensor 1002 cannot be used. By providing separate flip coils (i.e., the magnetisation of the two sensors takes place at different times), the overcurrent detection sensor 1000 can still be used to monitor current during the dead time whilst the AMR field sensor 1002 is out of use.

In this example, the overcurrent detection sensor 1000 and AMR field sensor 1002 are shown as being disposed on separate integrated circuits 1008A, 1008B, although it will be appreciated that they may also be placed on a single integrated circuit.

Figure 11:
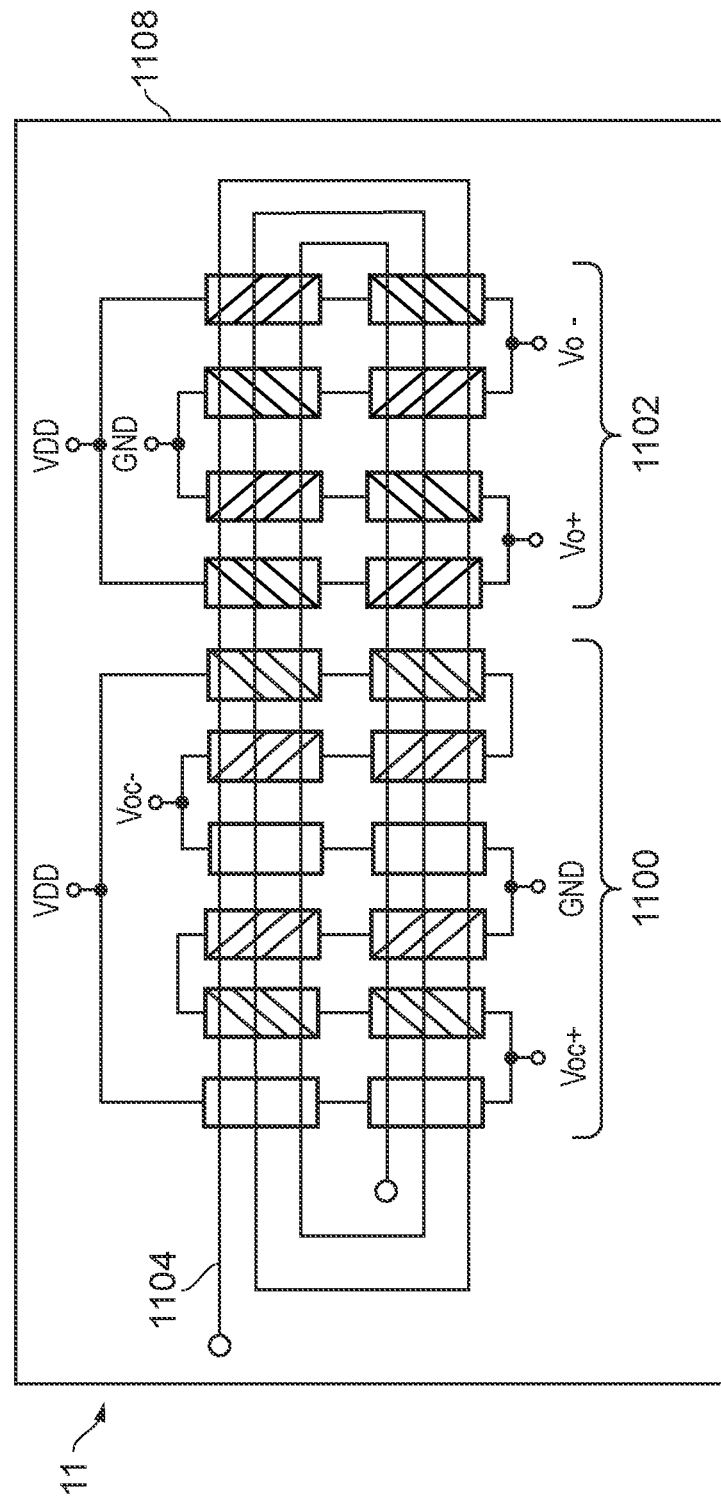
FIG. 11 is a further example of a sensor system in accordance with embodiments of the present disclosure.

FIG. 11 illustrates a further example of a sensor system 11 disposed on an integrated circuit 1108, wherein the overcurrent detection sensor 1100 is connected in a Wheatstone bridge arrangement to further reduce cross field effects, as opposed to the half bridge arrangement shown in FIG. 9. As such, each half bridge comprises two AMR resistor elements having no barber poles and a field insensitive part comprising two pairs of barber pole resistors having opposing barber pole directions. The AMR field sensor 1102 is substantially the same as that shown in FIG. 8. In this example, a single flip coil 1104 is provided over both sensors 1100, 1102; however, as illustrated in FIG. 12, it will be appreciated that respective flip coils 1204, 1206 may be provided over (or under) each of the sensors 1200, 1202.

In other arrangements, the overcurrent detection sensors described herein may also be used for detecting and measuring any cross-fields in the vicinity of the AMR field sensor that may affect the magnetic field measurements, cross-fields being magnetic fields having a direction perpendicular to that of the magnetic field being measured. An example of this is provided by FIG. 13, which illustrates a sensor system 13 comprising an overcurrent detection sensor 1300 and an AMR field sensor 1302 disposed on an integrated circuit 1308, wherein the overcurrent detection sensor 1300 is rotated 90° so that it is perpendicular to the sensing direction of the AMR field sensor 1302. By rotating the overcurrent detection sensor 1300 by 90°, it is sensitive to magnetic fields that are perpendicular to the sensing direction, and can thus be used to measure the strength of any cross-fields present and thereby compensate the measurement made by the AMR field sensor 1302.

Figure 12:
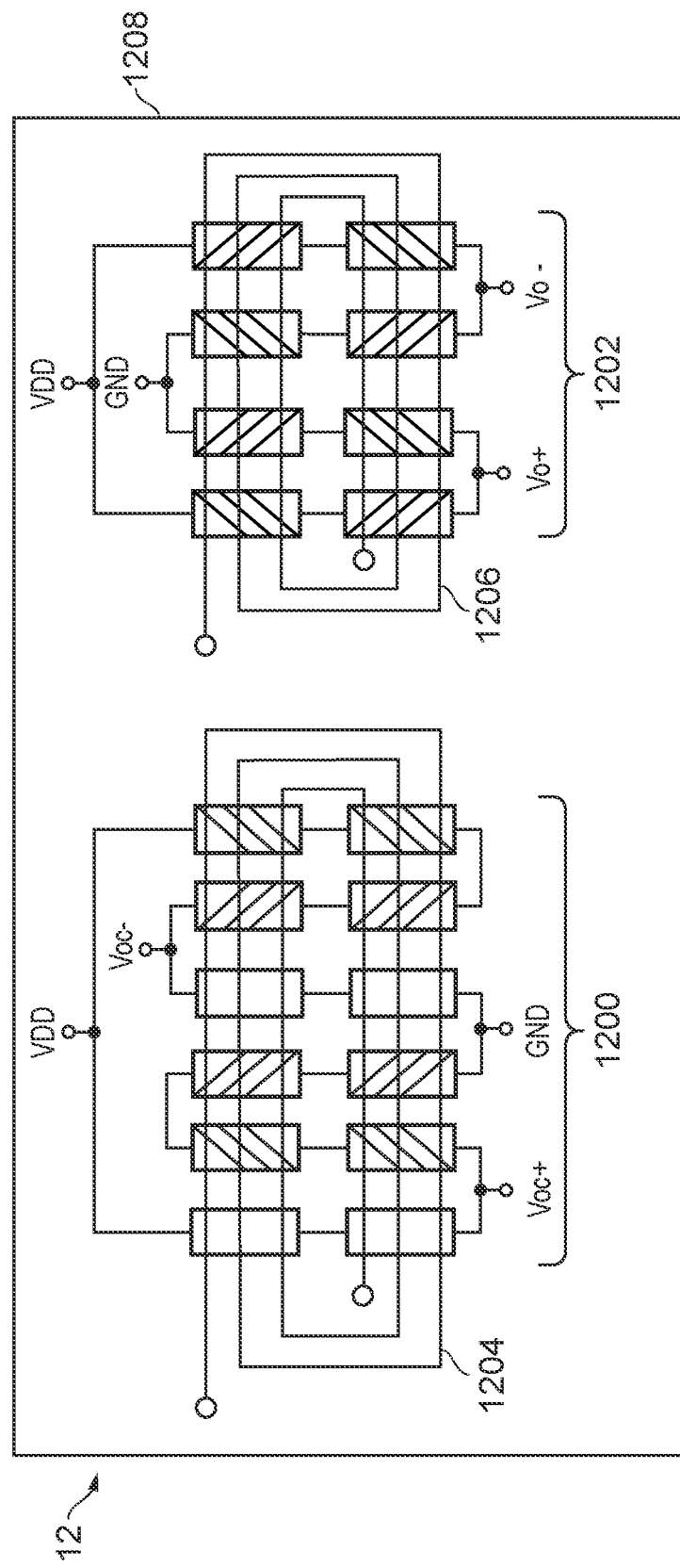
FIG. 12 is a further example of a sensor system in accordance with embodiments of the present disclosure.

In this example, the overcurrent detection sensor 1300 is similar to that shown in FIGS. 11 and 12, however, it will be appreciated that any of the overcurrent detection sensors described herein may be used for detecting cross-field.

Figure 14:
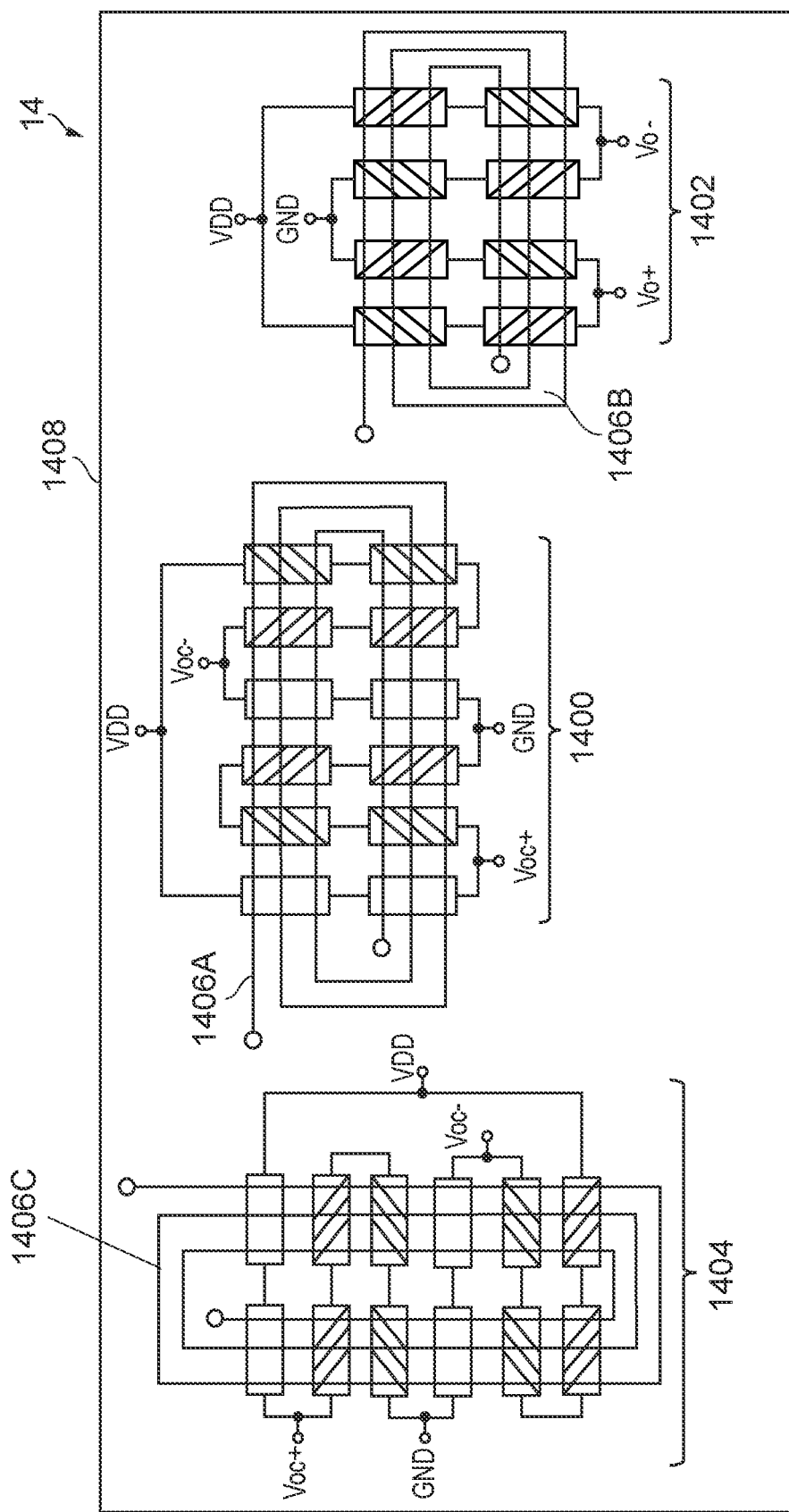
FIG. 14 is yet a further example of a sensor system in accordance with embodiments of the present disclosure.

FIG. 14 illustrates a further example of a sensor system 14 comprising a first overcurrent detection sensor 1400, an AMR field sensor 1402 and a second overcurrent detection sensor 1404 disposed on an integrated circuit 1408. The first overcurrent detection sensor 1400 is arranged in line with the sensing direction of the AMR field sensor 1402 and is thus used for detecting overcurrent as described previously. The second overcurrent detection sensor 1404 is arranged perpendicular to the sensing direction of the AMR field sensor 1402 and is thus used for detecting cross-fields. In this example, each of the sensors is provided with a separate flip coil 1406A-C, although it will be appreciated that the same flip coil may be used for the first overcurrent detection sensor 1400 and AMR field sensor 1402.

The arrangements described herein may be extended to applications involving differential field sensing, as will now be described. In this respect, the use of a differential field can be advantageous over an absolute field in that homogenous stray fields are excluded from the field measurement.

Figure 15A:
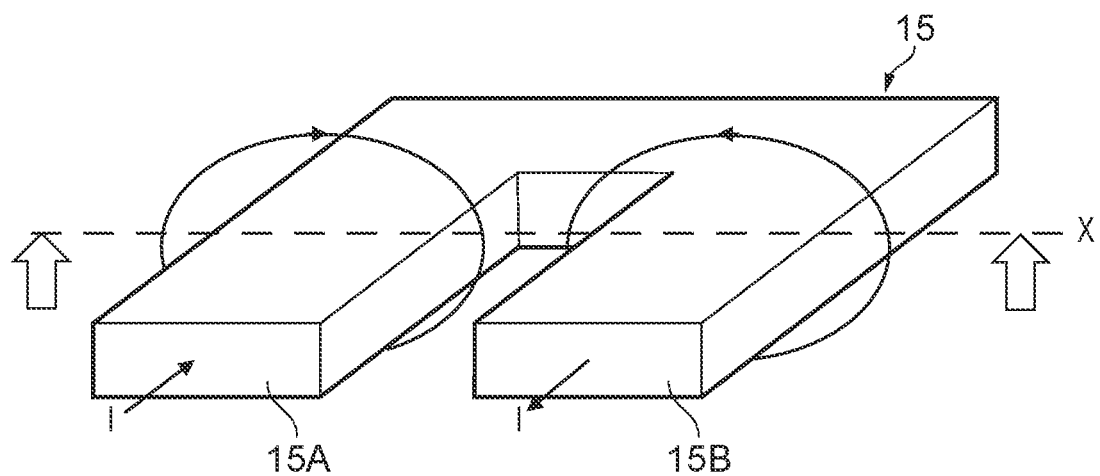
FIGS. 15A-B illustrate an example of how a differential magnetic field is generated.
Figure 15B:
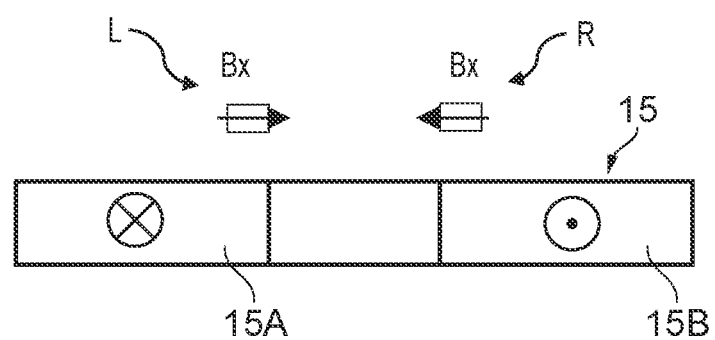

FIGS. 15A-B illustrate one example way in which a differential field can be generated, using a U-shaped bar 15. In use, a current, is applied to one arm 15A of the bar 15, which then flows around the bar 15 and out of the other arm 15B. As can be seen from the cross-sectional view shown in FIG. 15B (where the cutting plane is denoted by line X in FIG. 15A), two magnetic fields, Bx, are generated perpendicular to the current flow; a first magnetic field on the left-hand side of the bar 15 (denoted L) that points in one direction perpendicular to current flow (clockwise around the first arm 15A), and a second magnetic field on the right-hand side of the bar 15 (denoted R) that points in the opposite direction perpendicular to current flow (anti-clockwise around the second arm 15B). As such, two magnetic fields of the same strength but opposite directions are generated, thereby providing a differential magnetic field. This differential magnetic field can thus be measured by an AMR field sensor as described herein to thereby measure the strength of the current input to the U-shaped bar 15.

Figure 16:
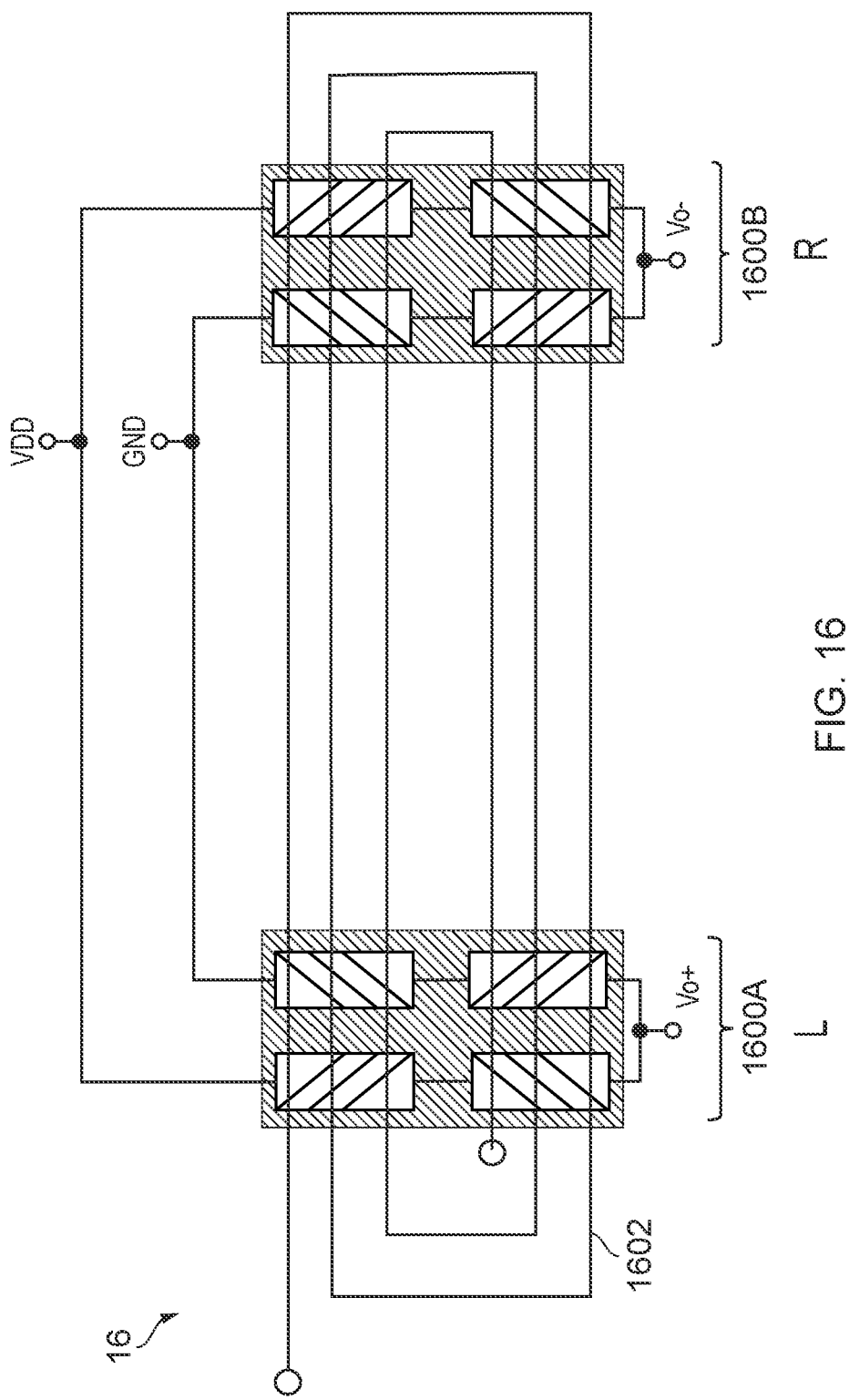
FIG. 16 illustrates an example of a differential field sensor.

FIG. 16 illustrates an example of a differential field sensor 16. As with the AMR field sensors described above with reference to FIGS. 8 to 14, the differential field sensor 16 comprises eight AMR barber pole resistors connected in a Wheatstone bridge arrangement between the voltage supply VDD and ground GND, with a flip coil 1602 placed over the resistors. However, in this example, the two half bridges 1600A, 1600B are separated by a certain distance so that each half bridge 1600A, 1600B is arranged at a position corresponding to one part of the differential magnetic field. Referring back to the example of FIGS. 15A-B, the first half bridge 1600A is arranged to measure the magnetic field generated on the left-hand side (L) of the bar 15 and the second half bridge 1600B is arranged to measure the magnetic field generated on right-hand side (R) of the bar 15. A differential output signal is thus produced between Vo$^+$ and Vo$^-$.

Figure 17A:
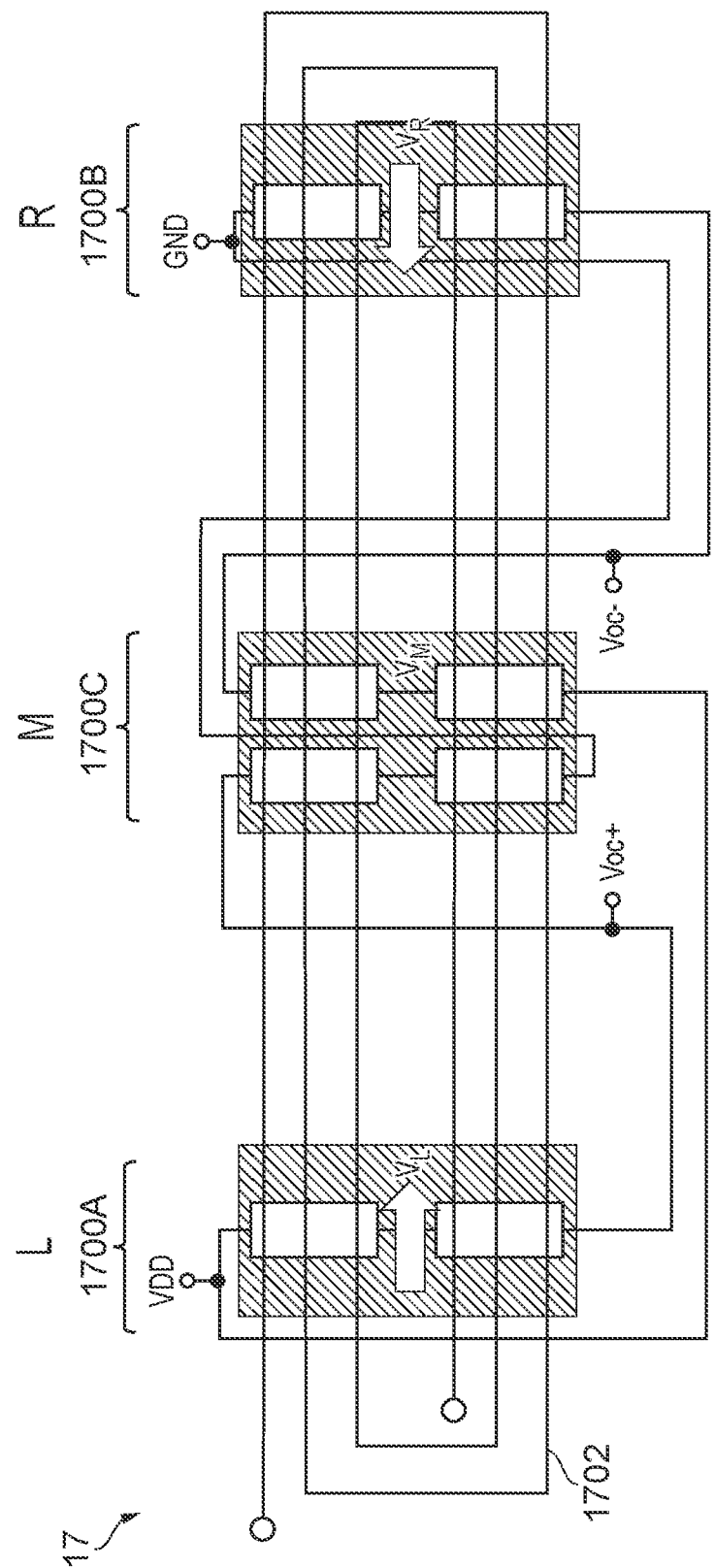
FIGS. 17A-B illustrate an overcurrent detection sensor for use with a differential field.

In contrast, because both half bridges 1600A, 1600B have the same barber pole arrangement, any homogeneous stray fields will result in an identical half bridge output change on both sides of the Wheatstone bridge. Consequently, no differential output is generated by the homogenous stray fields and thus they are excluded from the field measurement, FIG. 17A illustrates an example of an overcurrent detection sensor 17 for use with a differential field. The overcurrent detection sensor 17 comprises eight AMR resistors having no barber poles connected in a Wheatstone bridge arrangement between the voltage supply VDD and ground GND, with a flip coil 1702 placed over the resistors. The two half bridges are separated into three areas 1700A-1700C. The resistors of the first half bridge are divided between the left section 1700A and the middle section 1700C, whilst the resistors of the second half bridge are divided between the right section 1700B and the middle section 1700C. Referring again to the example of FIGS. 15A-B, the resistors of the left section 1700A are arranged to measure the magnetic field generated on the left-hand side (L) of the bar 15, resistors of the right section 1700B are arranged to measure the magnetic field generated on the right-hand side (R) of the bar 15, and the resistors of the middle section 1700C are arranged to measure the magnetic field experience in the middle portion between the two arms 15A, 15B of the bar 15.

Figure 17B:
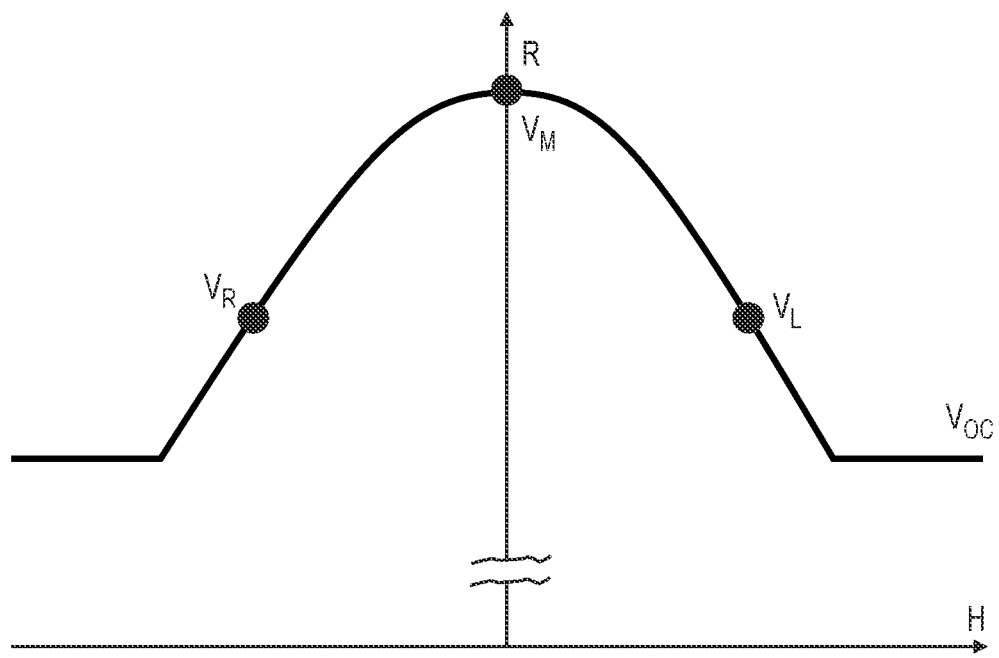

An example of the output $V_{OC}$ of the overcurrent detection sensor 17 is shown in FIG. 17B. In the example of FIGS. 15A-B, a magnetic field is only being generated in the left-hand and right-hand areas of the U-shaped bar 15. The resistors of the left section 1700A thus experience a positive magnetic field, which produces a corresponding change in resistance and a non-zero output (denoted $V_L$). Similarly, the resistors of the right section 1700B experience a negative magnetic field, which produces a corresponding change in resistance and a non-zero output (denoted $V_R$). In the middle section 1700C, there is no effective field experienced, thereby providing a zero output (denoted $V_M$). As such, as with the examples described previously, the output signal $V_{OC}$ of the overcurrent detection sensor 17 can be used to determine the field strength of the differential magnetic field, with very high magnetic fields being indicative of overcurrent in the system. In this case, instead of having a field insensitive resistor, resistors 1700C are placed in an area with no effective field. However, this arrangement has the advantage that it can be used to monitor a differential field whilst being insensitive to homogeneous stray fields.

Figure 18:
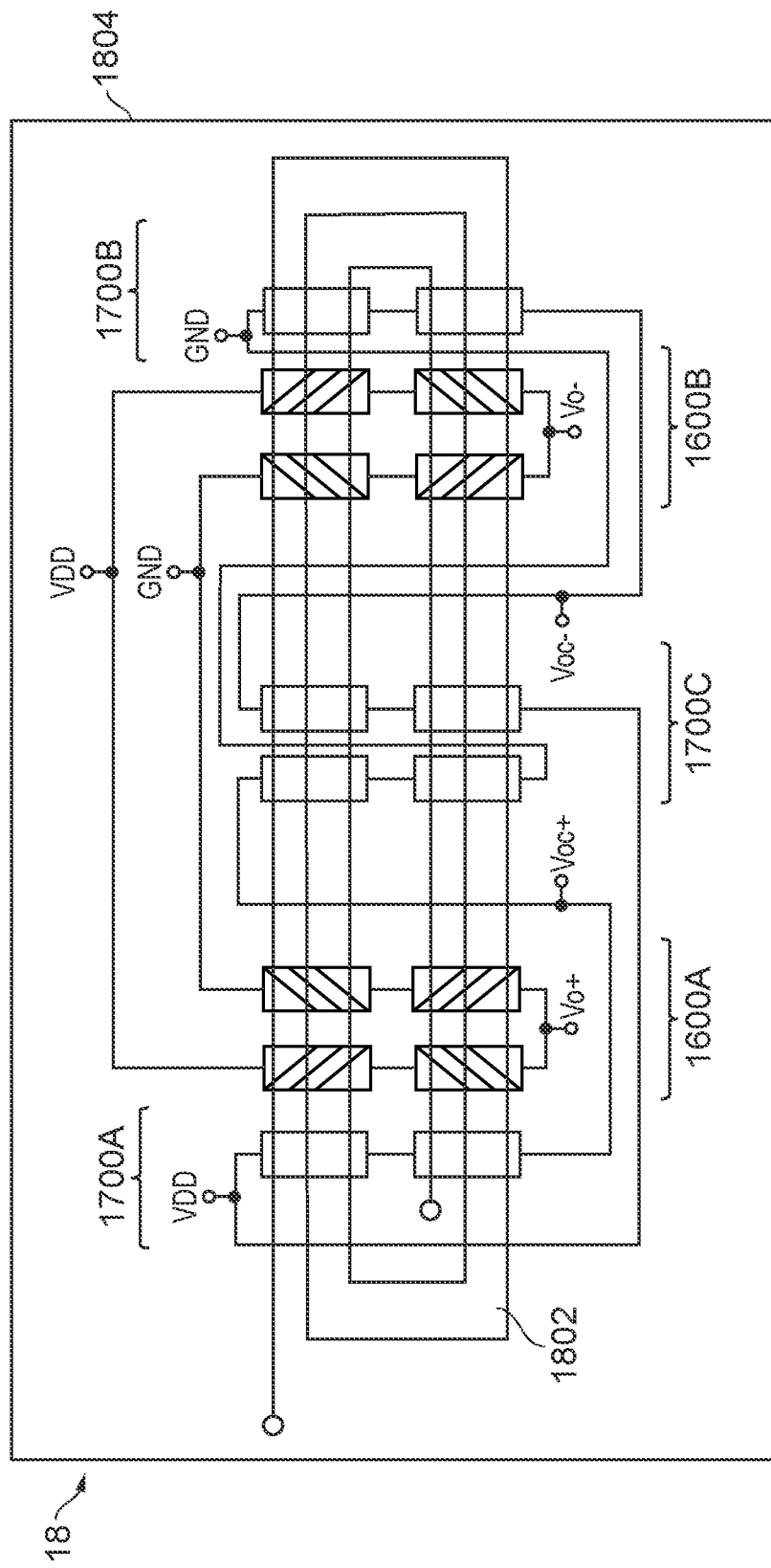
FIG. 18 illustrates an example of a sensor system in accordance with embodiments of the disclosure.

As illustrated by FIG. 18, a sensor system 18 may then be provided comprising the differential field sensor of FIG. 16 and the overcurrent detection sensor of FIG. 17 disposed on an integrated circuit 1804 and provided with a single flip coil 1802.

Figure 13:
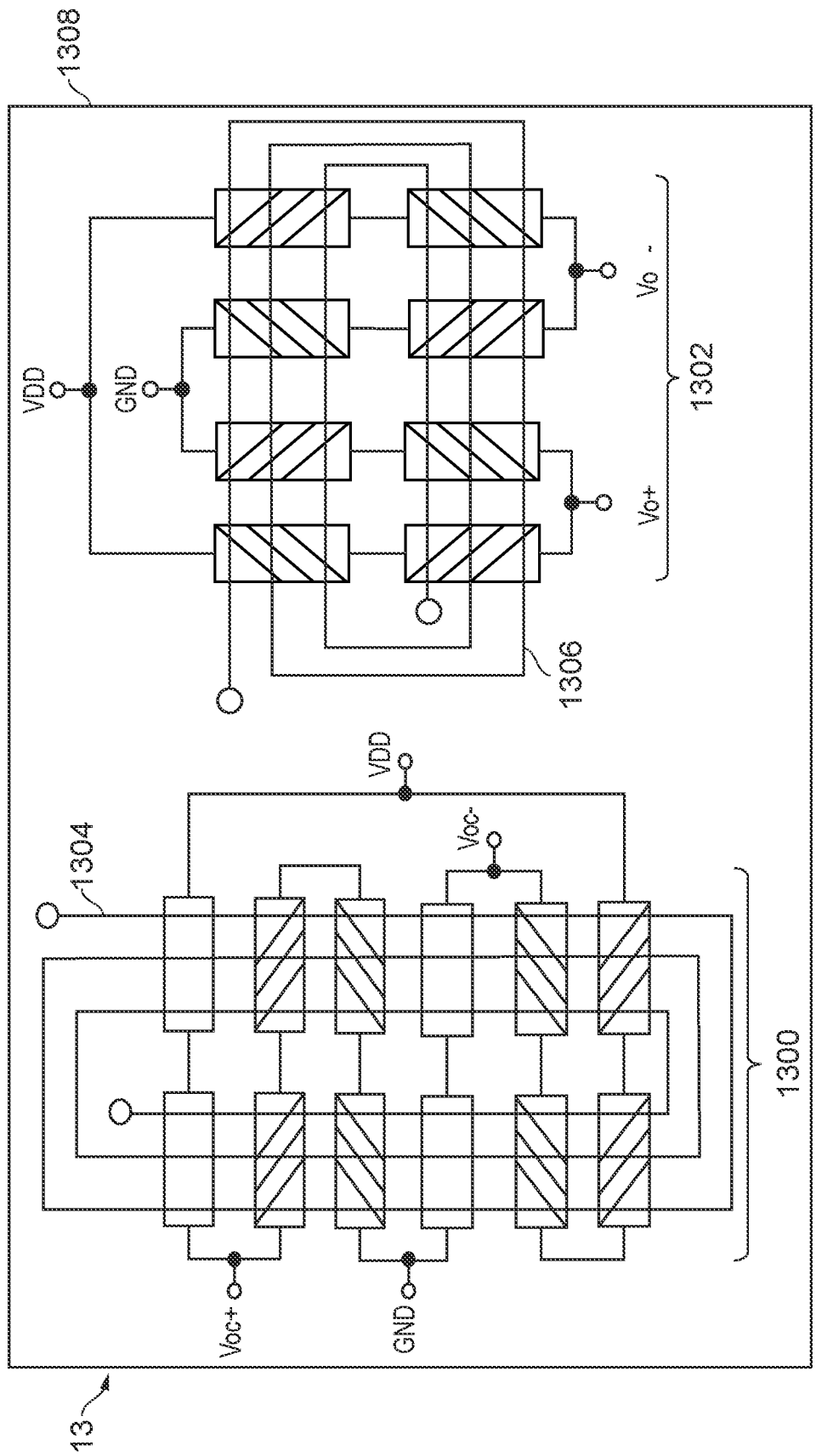
FIG. 13 is another example of a sensor system in accordance with embodiments of the present disclosure.
Figure 19:
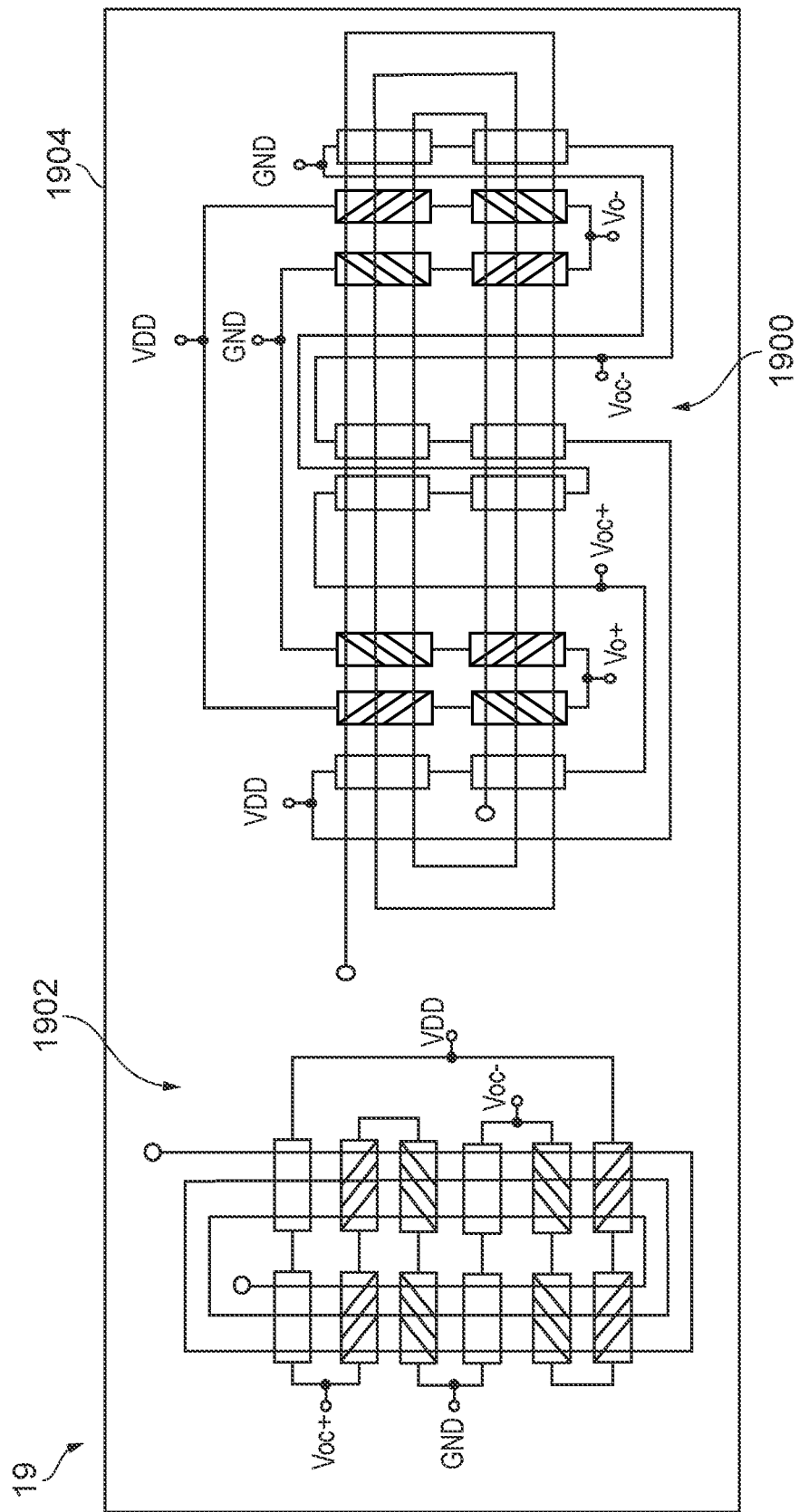
FIG. 19 illustrates an example of a sensor system in accordance with embodiments of the disclosure.

FIG. 19 illustrates a further example of a sensor system 19, comprising a differential field sensor and overcurrent detection sensor (shown generally at 1900), combined with a separated cross field detector 1902 similar to that described with reference to FIGS. 13 and 14.

Various modifications, whether by way of addition, deletion and/or substitution, may be made to all of the above described embodiments to provide further embodiments, any and/or all of which are intended to be encompassed by the appended aspects.

For example, it will be appreciated that any of the examples described herein may be implemented using a single flip coil or separate flip coil for each of the sensors. Similarly, the sensor systems described above may be implemented by providing the respective sensors on a single integrated circuit or separate integrated circuits.

APPLICATIONS

Any of the principles and advantages discussed herein can be applied to other systems, not just to the systems described above. Some embodiments can include a subset of features and/or advantages set forth herein. The elements and operations of the various embodiments described above can be combined to provide further embodiments. The acts of the methods discussed herein can be performed in any order as appropriate. Moreover, the acts of the methods discussed herein can be performed serially or in parallel, as appropriate. While circuits are illustrated in particular arrangements, other equivalent arrangements are possible.

Any of the principles and advantages discussed herein can be implemented in connection with any other systems, apparatus, or methods that benefit could from any of the teachings herein. For instance, any of the principles and advantages discussed herein can be implemented in connection with any devices with a need for correcting rotational angle position data derived from rotating magnetic fields. Additionally, the devices can include any magnetoresistance or Hall effect devices capable of sensing magnetic fields.

Aspects of this disclosure can be implemented in various electronic devices or systems. For instance, phase correction methods and sensors implemented in accordance with any of the principles and advantages discussed herein can be included in various electronic devices and/or in various applications. Examples of the electronic devices and applications can include, but are not limited to, servos, robotics, aircraft, submarines, toothbrushes, biomedical sensing devices, and parts of the consumer electronic products such as semiconductor die and/or packaged modules, electronic test equipment, etc. Further, the electronic devices can include unfinished products, including those for industrial, automotive, and/or medical applications.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected, or connected by way of one or more intermediate elements. Thus, although the various schematics shown in the figures depict example arrangements of elements and components, additional intervening elements, devices, features, or components may be present in an actual embodiment (assuming that the functionality of the depicted circuits is not adversely affected). The words "based on" as used herein are generally intended to encompass being "based solely on" and being "based at least partly on." Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values or distances provided herein are intended to include similar values within a measurement error.

While certain embodiments have been described, these embodiments have been presented by way of example only, and are not intended to limit the scope of the disclosure. Indeed, the novel apparatus, systems, and methods described herein may be embodied in a variety of other forms. Furthermore, various omissions, substitutions and changes in the form of the methods and systems described herein may be made without departing from the spirit of the disclosure.

The invention claimed is:

1. A magnetic field sensor system, comprising:
    an anisotropic-magnetoresistive (AMR) magnetic field sensor configured to measure an externally applied magnetic field;
    an overcurrent detection sensor comprising at least one AMR sensing element, the overcurrent detection sensor being configured to detect a presence of a high electrical current based on a measurement of the externally applied magnetic field; and
    a cross-field detection sensor comprising at least one AMR sensing element, wherein the at least one AMR sensing element is arranged in a plane perpendicular to a sensing direction of the AMR magnetic field sensor.

2. A magnetic sensor system according to claim 1, wherein the AMR magnetic field sensor is operable to provide an output signal indicative of magnetic field strength up to a threshold value.

3. A magnetic sensor system according to claim 2, wherein the overcurrent detection sensor is operable to provide the output signal indicative of magnetic field strength up to and over the threshold value.

4. A magnetic sensor system according to claim 2, wherein the overcurrent detection sensor detects the presence of a high electrical current if the output signal indicates the magnetic field strength above the threshold value.

5. A magnetic sensor system according to claim 1, wherein the overcurrent detection sensor further comprises a field insensitive component.

6. A magnetic sensor system according to claim 5, wherein the AMR sensing element of the overcurrent detection sensor and the field insensitive component are connected in a half bridge configuration.

7. A magnetic sensor system according to claim 5, wherein the field insensitive component comprises at least two AMR barber pole resistors comprising a strip of anisotropic-magnetoresistive material having a plurality of conductive strips disposed on the strip of anisotropic-magnetoresistive material at an angle relative to a longitudinal axis of the strip of anisotropic-magnetoresistive material, the at least two AMR barber pole resistors being connected in series and having conductive strips orientated in opposing directions.

8. A magnetic sensor system according to claim 5, wherein the field insensitive component comprises a strip of anisotropic-magnetoresistive material having a large shape anisotropy.

9. A magnetic sensor system according to claim 5, wherein the field insensitive component comprises a plurality of AMR sensing elements connected in series and a soft magnetic shield placed in proximity to the plurality of AMR sensing elements.

10. A magnetic sensor system according to claim 1, wherein the overcurrent detection sensor comprises at least two AMR sensing elements and at least two field insensitive components, connected in a Wheatstone bridge configuration.

11. A magnetic sensor system according to claim 1, wherein the overcurrent detection sensor comprises:
    at least two AMR sensing elements connected in series; and
    a field insensitive component comprising at least one pair of AMR barber pole resistors connected in series, each AMR barber pole resistor comprising a strip of anisotropic-magnetoresistive material having a plurality of conductive strips disposed on the strip of anisotropic-magnetoresistive material at an angle relative to a longitudinal axis of the strip of anisotropic-magnetoresistive material;
    wherein the at least two AMR sensing elements and the field insensitive component are connected to form a first half bridge arrangement.

12. A magnetic sensor system according to claim 11, wherein the plurality of conductive strips of each AMR barber pole resistor are orientated in the same direction, and wherein the strip of anisotropic-magnetoresistive material of each AMR barber pole resistor is magnetised in opposing directions.

13. A magnetic sensor system according to claim 11, wherein the at least one pair of AMR barber pole resistors comprise:
    a first pair of AMR barber pole resistors, each having a plurality of conductive strips orientated at a first angle, wherein the strip of anisotropic-magnetoresistive material of each AMR barber pole resistor in the first pair is magnetised in opposing directions; and
    a second pair of AMR barber pole resistors, each having a plurality of conductive strips orientated at a second angle, the second angle being different to the first angle, wherein the strip of anisotropic-magnetoresistive material of each AMR barber pole resistor in the second pair is magnetised in opposing directions.

14. A magnetic sensor system according to claim 11, wherein the overcurrent detection sensor comprises a second half bridge arrangement, the second half bridge arrangement comprising:
    at least two AMR sensing elements connected in series; and
    a field insensitive component comprising at least one pair of AMR barber pole resistors connected in series;

wherein the first and second half bridge arrangements are connected in a Wheatstone bridge configuration.

15. A magnetic sensor system according to claim 1, further comprising at least one flipping coil arranged in proximity to the AMR magnetic field sensor and the overcurrent detection sensor.

16. A magnetic sensor system according to claim 1, further comprising a cross-field detection sensor comprising at least one AMR sensing element, wherein the at least one AMR sensing element is arranged in a plane perpendicular to a sensing direction of the AMR magnetic field sensor.

17. A magnetic sensor system according to claim 1, wherein the overcurrent detection sensor comprises:
   a first set of AMR sensing elements connected in a first half bridge arrangement and operable to output a signal indicative of a magnetic field strength of a first differential magnetic field up to and over a threshold value; and
   a second set of AMR sensing elements connected in a second half bridge arrangement and operable to output a signal indicative of a magnetic field strength of a second differential magnetic field up to and over the threshold value.

18. A magnetic sensor system according to claim 17, wherein the first set of AMR sensing elements comprise a first pair of sensing elements located at a first sensing position in a vicinity of the first differential magnetic field and a second pair of sensing elements located at a second sensing position, the first and second sensing position being separated by a first distance; and
   wherein the second set of AMR sensing elements comprise a third pair of sensing elements located at the second sensing position and a fourth pair of sensing elements located at a third sensing position in the vicinity of the second differential magnetic field, the second and third sensing position being separated by a second distance;
   wherein the second sensing position is between the first and third sensing position.

19. A magnetic sensor system according to claim 1, wherein the AMR magnetic field sensor comprises:
   a plurality of AMR barber pole resistors, each AMR barber pole resistors comprising a strip of anisotropic-magnetoresistive material having a plurality of conductive strips disposed on the strip of anisotropic-magnetoresistive material and orientated at an angle relative to a longitudinal axis of the strip of anisotropic-magnetoresistive material;
   wherein the plurality of AMR barber pole resistors are connected in a Wheatstone bridge configuration.

20. A magnetic sensor system according to claim 19, wherein the AMR magnetic field sensor comprises:
   a first set of AMR barber pole resistors connected in a first half bridge arrangement and operable to output a signal indicative of a magnetic field strength of a first differential magnetic field up to a first threshold value; and
   a second set of AMR barber pole resistors connected in a second half bridge arrangement and operable to output a signal indicative of a magnetic field strength of a second differential magnetic field up to a second threshold value.

21. A magnetic field sensor system, comprising:
   an anisotropic-magnetoresistive (AMR) magnetic field sensor configured to measure an externally applied magnetic field; and
   an overcurrent detection sensor comprising at least one AMR sensing element, the overcurrent detection sensor being configured to detect a presence of a high electrical current based on a measurement of the externally applied magnetic field, wherein the overcurrent detection sensor comprises:
      at least two AMR sensing elements connected in series; and
      a field insensitive component comprising at least one pair of AMR barber pole resistors connected in series, each AMR barber pole resistor comprising a strip of anisotropic-magnetoresistive material having a plurality of conductive strips disposed on the strip of anisotropic-magnetoresistive material at an angle relative to a longitudinal axis of the strip of anisotropic-magnetoresistive material;
      wherein the at least two AMR sensing elements and the field insensitive component are connected to form a first half bridge arrangement.

22. A magnetic sensor system according to claim 21, wherein the plurality of conductive strips of each AMR barber pole resistor are orientated in the same direction, and wherein the strip of anisotropic-magnetoresistive material of each AMR barber pole resistor is magnetised in opposing directions.

23. A magnetic sensor system according to claim 21, wherein the at least one pair of AMR barber pole resistors comprise:
   a first pair of AMR barber pole resistors, each having a plurality of conductive strips orientated at a first angle, wherein the strip of anisotropic-magnetoresistive material of each AMR barber pole resistor in the first pair is magnetised in opposing directions; and
   a second pair of AMR barber pole resistors, each having a plurality of conductive strips orientated at a second angle, the second angle being different to the first angle, wherein the strip of anisotropic-magnetoresistive material of each AMR barber pole resistor in the second pair is magnetised in opposing directions.

24. A magnetic sensor system according to claim 21, wherein the overcurrent detection sensor comprises a second half bridge arrangement, the second half bridge arrangement comprising:
   at least two AMR sensing elements connected in series; and
   a field insensitive component comprising at least one pair of AMR barber pole resistors connected in series;
   wherein the first and second half bridge arrangements are connected in a Wheatstone bridge configuration.

* * * * *